United States Patent [19]

Buff

[11] 4,225,794
[45] Sep. 30, 1980

[54] VOLTAGE CONTROLLED AMPLIFIER

[76] Inventor: Paul C. Buff, 2817 Erica Pl., Nashville, Tenn. 37204

[21] Appl. No.: 945,432

[22] Filed: Sep. 25, 1978

[51] Int. Cl.³ .............................................. G06G 7/12
[52] U.S. Cl. ................................... 307/229; 307/230; 328/145; 328/160
[58] Field of Search ................ 307/229, 230; 328/145, 328/160; 364/857

[56] References Cited

U.S. PATENT DOCUMENTS

| | | | |
|---|---|---|---|
| 3,681,618 | 8/1972 | Blackmer | 328/145 |
| 3,712,989 | 1/1973 | Barton | 328/145 |
| 3,714,462 | 1/1973 | Blackmer | 307/229 |
| 4,002,977 | 1/1977 | Sun et al. | 328/145 |
| 4,109,165 | 8/1978 | Katakura et al. | 328/145 |

Primary Examiner—Stanley D. Miller, Jr.
Assistant Examiner—B. P. Davis
Attorney, Agent, or Firm—Harrington A. Lackey

[57] ABSTRACT

A voltage controlled amplifier or multiplier circuit including a dual polarity rectifier for dividing the AC input signal into first and second unipolar signals, the first unipolar signal being the positive excursion of the AC input signal and the second unipolar signal being the inverted negative portion of the AC signal. Each unipolar signal is processed through a separate, conventional, unipolar log-antilog amplifier circuit, to each of which is applied a control voltage. The resultant unipolar signals are then subtracted in a differential amplifier to reconstitute the waveform of the original AC input signal, thereby producing the gain-controlled output signal.

9 Claims, 2 Drawing Figures

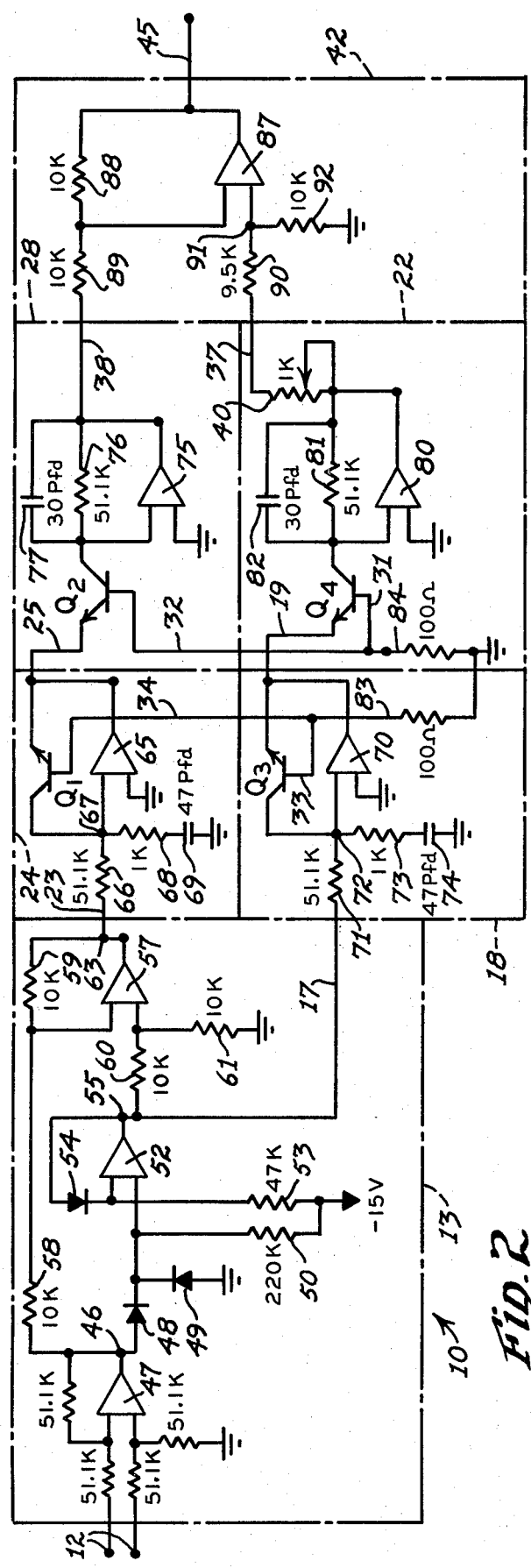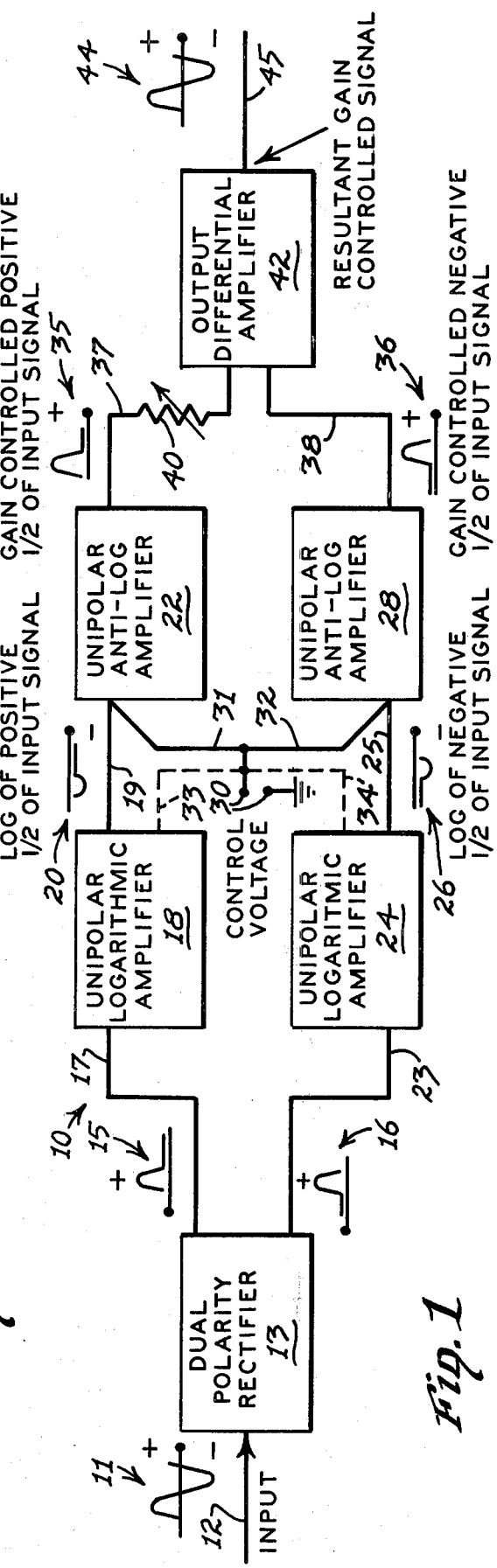

VOLTAGE CONTROLLED AMPLIFIER

BACKGROUND OF THE INVENTION

This invention relates to voltage controlled amplifiers, and more particularly to a voltage controlled amplifier capable of operating with bipolar input signals, or capable of two quadrant, low noise operation.

Unipolar circuits capable of producing a logarithmic response are well known in the art, and are disclosed in the Gibbons U.S. Pat. No. 3,237,028.

The Gibbons U.S. Pat. No. 3,293,450 disclosed unipolar circuits capable of having anti-logarithmic response, and also discloses the combination of a unipolar circuit capable of logarithmic response and a unipolar circuit capable of anti-logarithmic response to perform certain mathematical functions, such as multiplication.

The Pearlman U.S. Pat. No. 3,329,836 discloses that it is old to provide a logarithmic amplifier circuit having double feedback loops to render it capable of handling bipolar input signals.

The Embley U.S. Pat. No. 3,532,868 discloses a log-antilog multiplier circuit capable of four quadrant multiplication, by introducing an offset voltage of sufficient magnitude to insure that the unipolar log-antilog elements remain in the unipolar domain to which the elements are log responsive. However, because the bias current or offset voltage must be greater than the signal current, then noise levels are greatly increased, and the input signals are limited to a range within the magnitude of the offset voltage.

The Blackmer U.S. Pat. No. 3,714,462 describes a bipolar multiplier circuit including an input amplifier having double feedback loops, each including a log transistor of opposite polarity from each other. Each log transistor is connected to an antilog transistor, the antilog transistors also being of opposite polarity or conductivity from each other. A voltage control signal is applied to one or more of each of the log transistors and the antilog transistors.

Although the bipolar multiplier circuit of the above Blackmer patent effectively eliminates the disadvantages of the multiplier circuit disclosed in the above Embley patent, nevertheless, the Blackmer circuit is affected by the differences in the parameters of transistors of different polarity or conductivity, which will cause the log-antilog elements to respond somewhat differently to positive signal wave forms than to negative signal wave forms. Accordingly, the Blackmer circuit would require very careful matching of transistor pairs, together with compensating circuitry to balance the inherent transistor differences and to obtain low distortion operation over a wide control range.

Furthermore, since present manufacturing processes do not permit the manufacture of monolithic pairs of transistors of opposite conductivity suitable for logarithmic amplifiers, matched pairs of discrete transistors are mandatory for successful operation of the Blackmer circuit. Moreover, the discrete transistors employed in the Blackmer circuit must be mounted on a common heat sink in order to maintain temperature equilibrium.

SUMMARY OF THE INVENTION

The voltage controlled amplifier or multiplier circuit made in accordance with this invention overcomes the above enumerated disadvantages by incorporating a pair of unipolar log-antilog amplifier circuits in their purest form, for bipolar operation.

The input unipolar signals for the pair of log-antilog amplifier circuits, to which a voltage control signal is applied, are produced by splitting the wave form of the AC input bipolar signal into its positive and negative portions, and then inverting the negative portion to form a positive excursion. The positive portion of the AC input signal forms the unipolar input signal for one of the log-antilog amplifier circuits, while the inverted negative portion of the AC input signal forms the unipolar input signal for the other of the log-antilog amplifier circuits. By thus splitting the AC input signals into portions having the same polarity, the more simplified and more reliable unipolar log-antilog elements may be incorporated to provide low distortion, minimal noise levels, a greater range of bipolar input signals, a monolithic log-antilog transistor mount, a higher degree of temperature equilibrium, and more economical manufacture.

The resultant unipolar, gain-controlled, signals from each of the log-antilog amplifier circuits are processed by a differential amplifier in order to reconstitute the original wave form of the input signal, and to produce the gain-controlled, resultant AC signal.

An important feature of this invention is that all of the transistors employed in the circuitry, including the log transistors and the anti-log transistors, may be of identical conductivity and polarity.

Moreover, a slight offset voltage may be introduced into the circuitry to make certain that both unipolar input signals are clearly of one and the same polarity.

Both the offset voltage and the control voltage appear as common mode signals in the output differential amplifier, where they are cancelled.

BRIEF DESCRIPTION OF THE DRAWINGS

FIG. 1 is a block circuit diagram of the voltage controlled amplifier apparatus made in accordance with this invention;

FIG. 2 is a schematic electrical circuit diagram of the apparatus.

DESCRIPTION OF THE PREFERRED EMBODIMENTS

Referring now to the drawings in more detail FIG. 1 discloses a block circuit diagram of the apparatus 10 in which an AC input signal having the waveform 11 is transmitted through the input lead 12 to a dual polarity rectifier device 13.

The dual polarity rectifier device 13 rectifies the AC input signal 11 to produce the positive portion of the waveform, and also separates and inverts the negative portion of the AC waveform to provide two separate rectified unipolar signals 15 and 16. In a preferred form of the invention, offset voltages are applied to both signals 15 and 16 in order to make certain that both signals operate at all times at the same polarity. As disclosed in FIG. 1, the input unipolar signals 15 and 16 are both of positive polarity. The circuit could be designed so that both input signals 15 and 16 are negative.

The first unipolar input signal 15 is transmitted through the first unipolar input line 17 to the unipolar logarithmic amplifier device 18. The unipolar signal 20 produced in the output lead 19 of the logarithmic amplifier device 18 is equal to the logarithm of the input signal 15. The first output signal 20 is then transmitted through the lead 19 to the unipolar antilog amplifier device 22.

In a similar manner, the unipolar input signal 16 is transmitted through the second log input lead 23 to the unipolar logarithmic amplifier device 24, where the output signal 26 appears in the log amp output lead 25. The log output signal 26, which is the log of the input signal 16, is transmitted through the lead 25 to the unipolar anti-log amplifier device 28.

A control voltage signal, considered the logarithm of the control voltage, is impressed across the control voltage supply terminals 30 to be transmitted through the respective leads 31 and 32 to the inputs of the respective first and second anti-log amplifier devices 22 and 28, or through the leads 33 and 34 to the respective log amplifier devices 18 and 24. Thus, the input signal to the unipolar anti-log amplifier device 22 is equal to the sum of the control voltage signal plus the signal 20. The input signal to the unipolar anti-log amplifier device 28 is equal to the sum of the control voltage signal and the log output signal 26. Thus, the input signal to the antilog amplifier device 22 is equal to the log of the control voltage plus the log of the input signal 15. In a similar manner, the input signal to the anti-log amplifier device 28 equals the log of the control voltage plus the log of the input unipolar signal 16.

The input signals to the respective anti-log amplifier devices 22 and 28 are then converted to the respective anti-logarithm unipolar output signals 35 and 36, appearing in the output leads 37 and 38 of the unipolar circuits.

A potentiometer 40 is placed in the output lead 37 in order to adjust the respective unipolar circuits for any circuit imbalance which might appear anywhere between the input and the output of the apparatus 10.

The unipolar output signals 35 and 36 are subtracted from each other in the output differential amplifier 42. Moreover, the common mode signals, such as the offset voltage and the control voltage are cancelled, thereby reconstituting the original waveform of the AC input signal 11 to form the gain-controlled, resultant signal 44 which appears in the resultant output lead 45.

Referring now to the more detailed electrical circuit diagram of FIG. 2, the dual polarity rectifier device 13 includes a conventional differential input buffer amplifier 47, whose primary function is to produce a low impedance voltage output signal at junction 46, in order to prevent distortion of the signal by the non-linear impedance presented by the rectifier elements, including the diodes 48 and 49 and the resistor 50. The diodes 48 and 49 and the resistors 50 form a high-speed, semi-precision, half-wave rectifier which passes the positive polarity input signals. Since this circuit is passive, it does not exhibit the high frequency distortions normally associated with an active, feedback half-wave rectifier of conventional design.

The amplifier 52, resistor 53 and the diode 54, in the feedback loop around the amplifier 52, function to cancel the voltage offset produced by the rectifier elements 48, 49 and 50, and to buffer the rectified signal to a low impedance. The diode 54 is intentionally biased to a quiescent current, which is higher than the bias current in the rectifier diodes 48 and 49. A resultant overall positive voltage offset, around 100 millivolts in a practical circuit, appear along with the rectified positive wave signal at junction 55, to produce the unipolar signal 15 (FIG. 1).

The amplifier 57, in cooperation with the resistors 58, 59, 60 and 61, function as a differential amplifier to subtract the buffered input signal appearing at junction 46 from the buffered and offset rectified signal 15 at junction 55. The resultant output of the differential amplifier 57, appearing at junction 63, will contain only the negative portion of the input signal 11, but inverted to become positive excursions, together with the offset voltage, previously described. The resultant signal at junction 63 is the single polarity input signal 16 disclosed in FIG. 1, and appearing as a positive excursion of the waveform.

As previously described in the description of the block circuit diagram of FIG. 1, the unipolar input signal 15 is transmitted from the junction 55 through line 17 to the unipolar logarithmic amplifier device 18. The second unipolar input signal 16 is transmitted from the junction 63 through input lead 23 into the unipolar logarithmic amplifier device 24.

The log amplifier device 24 includes an operational amplifier 65. NPN transistor Q1 has its emitter-collector circuit connected in a feedback loop around the operational amplifier 65. The input lead 23 includes resistor 66. The junction 67 between resistor 66 and operational amplifier 65 is grounded through resistor 68 and capacitor 69. The base of transistor Q1 may be biased through voltage supply lead 34, if desired. The log signal generated by the logarithmic amplifier device 24, which is the output of the operational amplifier 65, is transmitted through lead 25 to the anti-log amplifier device 28.

The circuitry of log amplifier device 18 is identical to that of the log amplifier device 24. Log amplifier device 18 includes operational amplifier 70. NPN transistor Q3 has its emitter-collector circuit connected in a closed feedback loop with the operational amplifier 70. The input lead 17 includes resistor 71. The junction 72 is grounded through the resistor 73 and capacitor 74. The base of the transistor Q3 may be biased through the supply control voltage lead 33, when desired. The output from the operational amplifier 70, which is signal 20 (FIG. 1), is transmitted through the lead 19 to the antilog amplifier device 22.

The circuitry of log amplifier devices 18 and 24 are of relatively conventional design. The resistor 68 and capacitor 69, as well as the resistor 73 and capacitor 74, serve as stabilizing elements to allow the corresponding operational amplifiers 65 and 70 to accommodate the additional gain caused by transistors Q1 and Q3, respectively.

Since the input signals 15 and 16 are unipolar in a positive direction and are further offset in a positive direction, the transistors Q1 and Q3 are held in conduction, regardless of the polarity or magnitude of the original input signal 11.

The anti-log amplifier device 28 includes an NPN anti-log transistor Q2 having its collector-emitter circuit in series with the input lead 25 and the operational amplifier 75. Resistor 76 and capacitor 77 are connected as feedback elements around operational amplifier 75. The resultant anti-log output signal 36 (FIG. 1) is transmitted through the lead 38 to the output differential amplifier 42.

The base of the anti-log transistor Q2 may be biased with the control voltage through the supply lead 32, when desired.

The anti-log amplifier device 22 contains circuitry, substantially identical to that included in the anti-log amplifier device 28. The log signal 20 is transmitted through the lead 19 to the emitter of NPN, anti-log transistor Q4, whose collector is connected to the operational amplifier 80. Resistor 81 and capacitor 82 are each connected as feedback elements around the operational amplifier 80. The output signal from the operational amplifier 80 is transmitted through the potentiometer 40 to the output differential amplifier 42.

The base of the anti-log transistor Q4 may be biased through the supply lead 31 with the control voltage.

The control voltage signal, or the log of the control voltage, may be supplied through either of the resistive supply circuits 83 and 84, disclosed in FIG. 2.

The circuitry of the anti-log amplifier devices 22 and 28 are of relatively conventional design.

The control voltage, as previously indicated, is impressed upon either of the supply circuits 83 or 84. When the circuit 83 is used, it causes attenuation with positive control voltages. However, when the supply circuit 84 is used, it causes attenuation with negative control voltages.

The differential amplifier device 42 includes operational amplifier 87 having a feedback loop including resistor 88. Input lead 38 includes resistor 89, while input lead 37 includes resistor 90. The junction 91 between the resistor 90 and the operational amplifier 87 is grounded through resistor 92. The output of the operational amplifier 87 is connected to the resultant output lead 45 upon which appears the gain-controlled, resultant signal 44 (FIG. 1). The circuitry of the output differential amplifier 42 functions to recombine the two halves of the waveform of the original AC input signal 11. The two unipolar, anti-log output signals 35 and 36 are subtracted to reform the precise waveform of the input AC signal 11 having the same positive and negative excursions, but of course being amplified or attenuated in proportion to the gain control voltage. The offset voltage impressed in the dual polarity rectifier 13, as well as the gain control voltage, which appear common mode in output signals 35 and 36, are cancelled in the output differential amplifier 42.

The adjustment, or balance control, potentiometer 40 permits adjustment of the magnitude of the unipolar signal appearing in the line 37, in order to compensate for inequalities in the two signal halves, caused by resistor inaccuracies, and by differences in the parameters of the transistors Q1, Q2, Q3 and Q4.

Since the input signal 16 was derived at junction 63, by subtracting the input signal at junction 46 from the rectified signal 15 at junction 55, through linear circuitry, it is assured that the difference, or inverse sum, of signals 15 and 16 is exactly equal to the original input signal 11. This is true, both mathematically and in practice, even though the rectification produced by the circuit of elements 48, 49, 50, 52, 53 and 54 may not be precisely accurate, since the inaccuracies therein produced will appear as common mode in input signals 15 and 16.

Since output signal 44 is the difference, or inverse sum, of the gain controlled signals originating as input signals 15 and 16, the common mode errors produced by the rectification process are cancelled, and a low distortion replica of the original AC input signal 11 is produced.

Other embodiments of the invention are possible, and should be construed as being within the scope of the original invention.

It will be noted that all of the transistors Q1, Q2, Q3 and Q4 are transistors of the same polarity and same conductivity. Accordingly, these transistors may be mounted on the same substrate to facilitate manufacturing. Furthermore, a high degree of temperature equilibrium is established for the various transistors because of the capability of monolithic fabrication of the transistors.

What is claimed is:

1. A voltage controlled amplifier apparatus comprising:
   (a) input means for dividing the positive and negative portions of the waveform of an A.C. input signal into first and second unipolar signals, respectively,
   (b) a first unipolar log amplifier circuit connected to said input means to receive only said first unipolar signal and to produce a first log signal logarithmically related to said first unipolar signal,
   (c) a second unipolar log amplifier circuit connected to said input means to receive only said second unipolar signal and to produce a second log signal logarithmically related to said second unipolar signal,
   (d) a first unipolar anti-log amplifier circuit having its input connected to the output of said first unipolar log amplifier circuit,
   (e) a second unipolar anti-log amplifier circuit having its input connected to the output of said second unipolar log amplifier circuit,
   (f) means for applying a gain control signal to both said first log signal and said second log signal to produce a first output signal at the output of said first unipolar anti-log amplifier circuit anti-logarithmically related to the sum of said gain control signal and said first log signal, and to produce a second output signal at the output of said second unipolar anti-log amplifier circuit anti-logarithmically related to the sum of said gain control signal and said second log signal, and
   (g) output means for combining said first and second output signals to produce a gain-controlled resultant signal reconstituting the original waveform of said input signal.

2. The invention according to claim 1 in which said input means comprises half wave rectifier means for dividing one polarity portion of said waveform from said input signal to produce said first unipolar signal, and means for subtracting said A.C. input signal from said first unipolar signal to produce said second unipolar signal of the same polarity as said first unipolar signal.

3. The invention according to claim 1 in which said output means comprises output differential amplifier means.

4. The invention according to claim 1 further comprising offset input means for impressing a slight offset voltage of the same polarity upon said first and second unipolar signals.

5. The invention according to claim 1 in which each of said first and second unipolar log amplifier circuits includes a log transistor, and each of said first and second unipolar anti-log amplifier circuits includes an anti-log transistor.

6. The invention according to claim 5 in which all said log transistors and all said anti-log transistors are of like polarity.

7. The invention according to claim 5 in which said means for applying a gain control signal comprises means for applying a gain control voltage to the base of each of said log transistors.

8. The invention according to claim 5 in which said means for applying a gain control signal comprises means for applying a gain control voltage to each of the bases of said anti-log transistors.

9. The invention according to claim 1 wherein means are provided for adjusting the gain of said first output signal relative to the gain of said second output signal.

* * * * *